United States Patent [19]
Tarui et al.

[11] Patent Number: 5,684,371
[45] Date of Patent: Nov. 4, 1997

[54] DRIVE CIRCUIT FOR A BIDIRECTIONAL FLOW CONTROL VALVE

[75] Inventors: Jun Tarui, Kariya; Shinji Sugihara, Motosu-gun; Akira Furukawa, Kariya, all of Japan

[73] Assignee: Nippondenso Co., Ltd., Kariya, Japan

[21] Appl. No.: 501,188

[22] Filed: Jul. 11, 1995

[30] Foreign Application Priority Data

Jul. 12, 1994 [JP] Japan .................... 6-160214
Feb. 28, 1995 [JP] Japan .................... 7-040339

[51] Int. Cl.$^6$ ........................................ H02K 23/00
[52] U.S. Cl. .................... 318/254; 318/138; 318/439; 363/58; 361/1
[58] Field of Search .................... 318/254, 138, 318/439; 363/58, 98, 132; 361/1, 63, 93; 251/129.01, 129.15

[56] References Cited

U.S. PATENT DOCUMENTS 3,551,747  12/1970  Joslyn .
4,169,990  10/1979  Ledman .................... 318/138
5,450,756   9/1995  Kirii et al. .................... 318/254 X

FOREIGN PATENT DOCUMENTS 422529    4/1991  European Pat. Off. .
3842426   6/1990  Germany .
6-54591   2/1994  Japan .

OTHER PUBLICATIONS

Patent Abstract of Japan, vol. 15, No. 49 (M-1078) Nov. 1990 re JP-A-02-283837.

Primary Examiner—Karen Masih
Attorney, Agent, or Firm—Cushman, Darby & Cushman IP Group of Pillsbury Madison & Sutro LLP

[57] ABSTRACT

A normal-direction mode which switches on first and fourth switches and in a mutually diagonal relationship of an H-type bridge circuit and switches off second and third switches also in a mutually diagonal relationship of the bridge circuit is executed for an on-duty time of an opening-degree command signal, and a reverse-direction mode which switches off the first and fourth switches and switches off the second and third switches is executed for an off-duty time of the opening-degree command signal. During normal operation, conduction of current to the H-type bridge circuit 70 and a coil is constantly performed irrespective of a degree of opening of a valve to be adjusted, and in a case where conduction is interrupted, it can be presumed that a broken wire has occurred in the H-type bridge circuit or coil, and determination of a broken wire can be made.

8 Claims, 6 Drawing Sheets

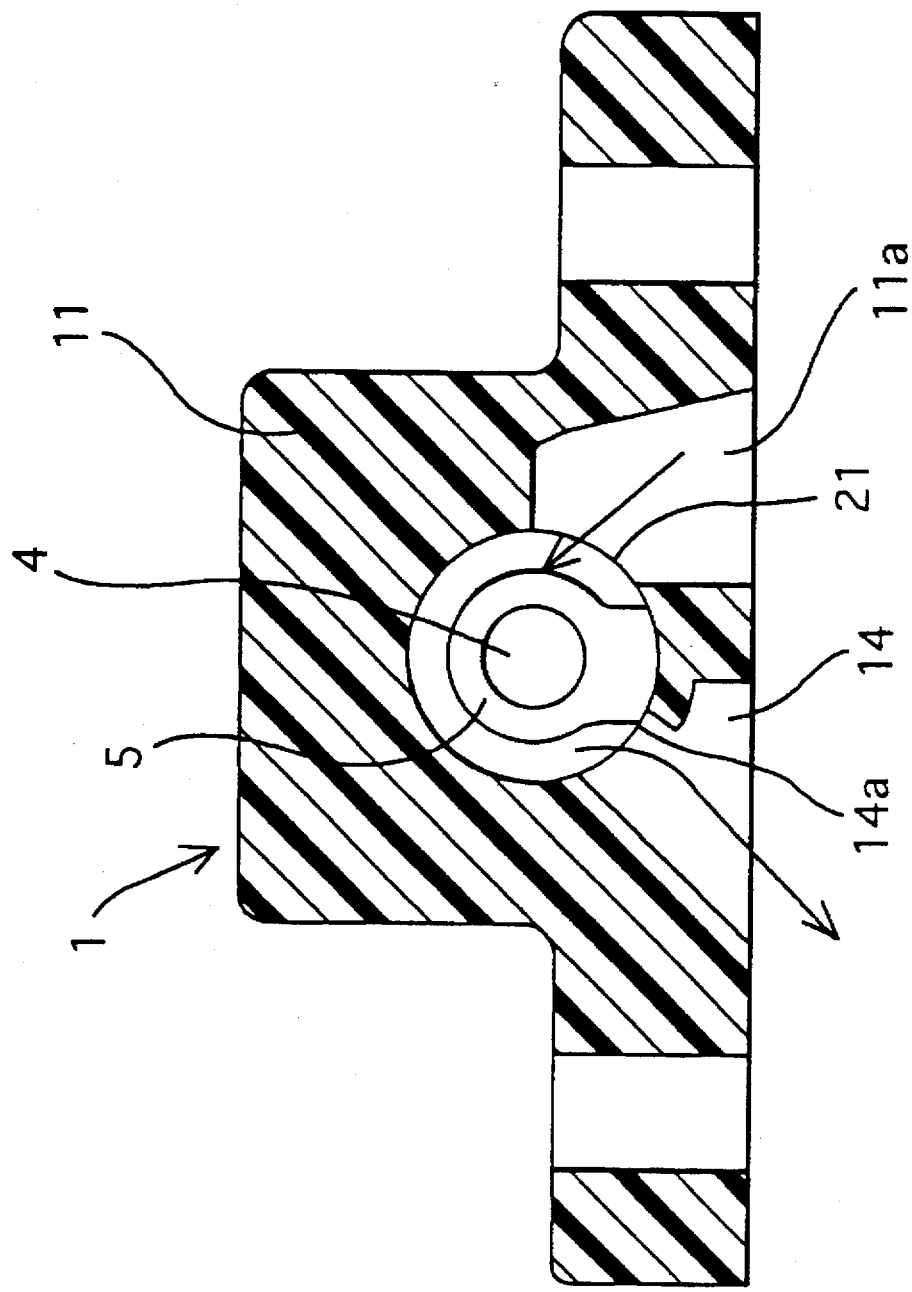

DRIVE CIRCUIT FOR A BIDIRECTIONAL FLOW CONTROL VALVE

CROSS REFERENCE TO RELATED APPLICATION

This application is based upon and claims priority from Japanese Patent Applications No. Hei 6-160214 filed Jul. 12, 1994 and No. Hei. 7-40339 filed Feb. 28, 1995, the contents of which are incorporated herein by reference.

BACKGROUND OF THE INVENTION

1. Field of the Invention

The present invention relates to a drive circuit for a bidirectional flow control valve.

2. Description of Related Art

A bidirectional flow control valve which assumes a neutral degree of opening during nonconduction, wherein a degree of opening is increased from the neutral degree of opening by an increase in conduction current of one direction to a coil, and wherein a degree of opening is decreased from the neutral degree of opening by an increase in conduction current of an opposite direction to the coil, has a safety feature such that the degree of valve opening does not suddenly change to fully closed or fully open even if a fault interrupting conduction to the coil occurs, and so is favorable for application in a throttle valve or the like.

The control operation according to the prior art when controlling the coil of a bidirectional flow control valve by an H-type bridge circuit of a known structure comprising a first switch to connect a high-level power-source terminal to an end of the coil, a second switch to connect a low-level power-source terminal to an end of the coil, a third switch to connect the high-level power-source terminal to another end of the coil, and a fourth switch to connect the low-level power-source terminal to another end of the coil, will be described hereinafter.

To cause the degree of opening of the valve to be a neutral degree of opening during nonconduction, the several switches are switched off. To cause the degree of opening of the valve to be increased from a neutral degree of opening during nonconduction, the first and fourth switches are switched on in accordance with an opening-degree command signal and the third and second switches are switched off. To cause the degree of opening of the valve to be decreased from a neutral degree of opening during nonconduction, the third and second switches are switched on in accordance with an opening-degree command signal and the first and fourth switches are switched off.

However, in the above-described drive circuit of a bidirectional flow control valve according to the prior art, there exists the problem that abnormality detection and measuring at a time of an abnormality for the H-type bridge circuit and the drive circuit thereof is not easy, and improvement of reliability of the device is difficult.

Firstly, in a case such as when a transistor of the H-type bridge circuit to be switched on experiences an open fault, the coil experiences a broken wire, or the control circuit which generates a control signal to control the H-type bridge circuit fails and a transistor to be switched on remains off, current flowing to the H-type bridge circuit becomes 0 with the above-described method operation according to the prior art, but current similarly becomes 0 during the above-described nonconduction and in a state of a neutral degree of opening where bidirectional conduction time has been equalized, and so determination of the two becomes difficult.

Additionally, in a case where the opening-degree command signal is uniform, the coil conduction current becomes uniform and the on-off time is normally established to be extremely short, and so the valve is substantially static at the degree of opening thereof, assuming a state of static friction, and there also exists the problem of occurrence of tracking delay and hysteresis characteristics.

SUMMARY OF THE INVENTION

In light of the foregoing problems, it is an object of the present invention to provide a drive circuit of a bidirectional flow control valve which can easily discover an interruption of the conduction current to a coil.

It is another object of the present invention to avoid problems such as the occurrence of valve tracking delay due to static friction, and a situation wherein a degree of valve opening and conduction current has hysteresis characteristics.

To attain the above objects, a first structure according to the present invention is a drive circuit for a bidirectional flow control valve, comprising:

an H-type bridge circuit to control conduction current to a bidirectional flow control valve which assumes a neutral degree of opening during nonconduction, where a degree of opening is increased from the neutral degree of opening by an increase in conduction current of one direction to a coil, and where a degree of opening is decreased from the neutral degree of opening by an increase in conduction current of an opposite direction to the coil; and a control circuit to control the H-type bridge circuit, wherein:

the H-type bridge circuit comprises a first switch to connect a high-level power-source terminal to an end of the coil, a second switch to connect a low-level power-source terminal to an end of the coil, a third switch to connect the high-level power-source terminal to another end of the coil, and a fourth switch to connect the low-level power-source terminal to another end of the coil; and the control circuit opens and closes the several switches at a predetermined cycle by an opening-degree command signal wherein:

the control circuit alternatingly repeats, at a uniform carrier frequency, a normal-direction conduction mode to switch on the first and fourth switches and switch off the second and third switches and a reverse-direction conduction mode to switch on the second and third switches and switch off the first and fourth switches, together with equalizing bidirectional conduction-execution times of the two modes when obtaining a degree of opening corresponding to the neutral degree of opening during nonconduction, increasing an execution time of the normal-direction conduction mode as well as decreasing an execution time of the reverse-direction conduction mode to increase an average conduction current of one direction to the coil when increasing a degree of opening from the neutral degree of opening during nonconduction, and decreasing an execution time of the normal-direction conduction mode as well as increasing an execution time of the reverse-direction conduction mode to decrease an average conduction current of an opposite direction to the coil when decreasing a degree of opening from the neutral degree of opening during nonconduction.

According to the first structure, a bidirectional flow control valve driven by a drive circuit executes, during an on-duty time of an opening-degree command signal, a normal-direction conduction mode to switch on first and fourth switches of an H-type bridge circuit and switch off third and second switches in a mutually diagonal relationship, and executes, during an off-duty time of the opening-degree command signal, a reverse-direction conduction mode to switch off the first and fourth switches and switch on the third and second switches. Herein, the foregoing on-duty time is a time in which pulses become high level in respective cycles of a carrier (carrier-wave signal), and the foregoing off-duty time is a time in which pulses become low level in one cycle of the carrier.

In this way, conduction to the H-type bridge circuit and coil is performed constantly at a normal time irrespective of the degree of opening, and as a result thereof, occurrence of a broken wire to the foregoing control circuit, H-type bridge circuit, or coil can be presumed in a case where conduction to the H-type bridge circuit or coil is interrupted (excluding a momentary state of interruption during conduction-direction switching), and it becomes possible to reliably determine abnormalities.

Additionally, according to the present invention, conduction in a first direction and conduction in an opposite direction are successively executed within respective cycles of the carrier (carrier-wave signal) of the opening-degree command signal, and so, if comparison is made in a case where only one conduction direction or the other is performed at a predetermined duty ratio within respective cycles of the carrier (carrier-wave signal) of the opening-degree command signal as explained above in the section on the related art, minute vibration—i.e., minute fluctuation in the degree of opening—to which a valve is subjected becomes large. For this reason the valve assumes a state of kinetic friction and the coefficient of friction declines even in a case of control at a uniform degree of opening on average, and improvement in response of the valve and alleviation of the above-described hysteresis can be achieved.

A second structure according to the present invention is a drive circuit for a bidirectional flow control valve according to the foregoing first structure, wherein:

the control circuit compares an end-portion voltage of the coil and a control voltage of the several switches to detect an open fault of the several switches.

According to the second structure of the present invention, in addition to the above-described first structure, the coil end-portion voltage and the switch control voltage are compared, and an open fault of the several switches is detected.

That is to say, the relationship between the coil end-portion voltage and the switch control voltage is the same at a normal time as during an open fault of the coil, but during an open fault of a switch, the relationship between the coil end-portion voltage and the switch control voltage differs from that at a normal time, and so an open fault of a switch alone can be discriminated easily and reliably.

A third structure according to the present invention is a drive circuit for a bidirectional flow control valve according to the foregoing first structure, wherein:

the control circuit detects conduction current to the H-type bridge circuit, together with determining an open fault of the coil when the conduction current becomes a predetermined level or less.

According to the third structure of the present invention, in addition to the above-described first structure, an open fault of the coil can be determined when the conduction current to the H-type bridge circuit becomes a predetermined level or less. That is to say, during an open fault of one switch, current flows while the pair of switches, not including the faulty switch, are on, and so the average current (ignoring momentary states) does not become 0. In comparison with this, the conduction current to the H-type bridge circuit becomes essentially 0 during an open fault of the coil, and so an open fault of the coil alone can be determined easily and reliably.

A fourth structure according to the present invention is a drive circuit for a bidirectional flow control valve according to the foregoing first structure, wherein:

the control circuit determines an abnormality of the first switch or the second switch from the coil end-portion voltage at a time of switching of the control voltage of the first switch or second switch, and determines an abnormality of the third switch or fourth switch from the coil end-portion voltage at a time of the switching of control voltage of the third switch or fourth switch.

According to the fourth structure of the present invention, in addition to the above-described first structure, an abnormality of the first switch or second switch is determined from the end-portion voltage of the coil at a time of switching of the control voltage of the first switch or second switch, and an abnormality of the third switch or fourth switch is determined from the end-portion voltage of the coil at a time of switching of control voltage of the third switch or fourth switch.

In this way, the influence of current due to coil inductance are avoided, and an open fault can reliably be detected.

A fifth structure according to the present invention is a drive circuit for a bidirectional flow control valve according to the foregoing first structure, wherein:

the control circuit detects overcurrent conduction to the H-type bridge circuit, together with interrupting all of the several switches at a time of detection of the overcurrent.

According to a fifth structure of the present invention, in addition to the above-described first structure, all switches are interrupted at a time of overcurrent detection.

In this way, shorting of the several switches of the H-type bridge circuit can be determined.

A sixth structure according to the present invention is a drive circuit for a bidirectional flow control valve according to the foregoing first structure, wherein:

the control circuit detects whether an opening-degree command signal, which is input to a control input terminal, changes within a predetermined time, together with detecting that the opening-degree command signal is abnormal in a case of no change.

According to the sixth structure of the present invention, in addition to the above-described first structure, an abnormality of an opening-degree command signal, for example dislodgement of a signal-transmission line, can be determined when an opening-degree command signal input to the control input terminal does not change within a predetermined time.

Briefly, the opening-degree command signal is composed of a pulse series repeated in the carrier cycle, and the opening-degree command signal is unchanged only in a case where a duty ratio (on-duty of these pulses) is 0% or 100%, but there is essentially no continuation of an extreme state such as this, and no impairment of operation occurs even if an abnormality is determined. In this way, an input abnormality of the opening-degree command signal, such as dislodgement of the signal-transmission line, can be detected with a simple structure.

Moreover, if characteristics of the bidirectional flow control valve are established so that a minimum degree of opening is obtained when the duty ratio of the opening-degree command signal is a value exceeding 0% and a maximum degree of opening is obtained when the duty ratio of the opening-degree command signal is a value less than 100%, there is no need to send a 0% or 100% duty ratio as the opening-degree command signal, and consequently, an abnormality of the received opening-degree command signal can be determined in a case where a 0% or 100% duty ratio is received.

A seventh structure according to the present invention is a drive circuit for a bidirectional flow control valve according to any one of the foregoing second through fifth structures, wherein:

the control circuit fixes an electrical potential of a control input terminal to which an opening-degree command signal is input to a high-level power-source potential or a low-level power-source potential at a time of detection of the fault or the abnormality or the overcurrent.

According to the seventh structure of the present invention, in addition to the any one of the above-described second through fifth structures, the electrical potential of the control input terminal is fixed at a high-level power-source potential or at a low-level power-source potential at a time of detection of an above-described fault, abnormality, or overcurrent.

In this way, an open fault or shorting of the H-type bridge circuit or coil can be reported to a controller sending the opening-degree command signal without additionally establishing a special transmission line.

That is to say, when the control input terminal of this drive circuit is fixed at a high-level power-source potential or at a low-level power-source potential, the electrical potential of a transmission-output terminal of the opening-degree command signal fluctuates accordingly, and notification of the abnormality can be achieved, thereby without providing of a special transmission line.

Furthermore, an opening-degree command signal from the transmitting side to the drive circuit is also deformed by the above-described potential-fixing, but the drive circuit no longer requires normal reception of the opening-degree command signal at a time of abnormality detection, and so adverse effects due to deformation of the opening-degree command signal are not received.

An eighth structure according to the present invention is a drive circuit for a bidirectional flow control valve according to any one of the foregoing second through fifth structures, wherein:

the control circuit is provided with a feed-circuit portion having a switching element for feeding current to a control input terminal to which an opening-degree command signal is input from an external portion via a signal line, a potential-fixing switching element to establish the signal input terminal at a predetermined electrical potential, and an interruption circuit portion to interrupt the switching element for feed use by breaking of a power-source line or ground line applying power-source voltage or ground voltage to the control circuit.

According to the eighth structure of the present invention, in addition to the any one of the above-described second through fifth structures, a switching element for feeding current to the control input terminal is interrupted in a case where a power-source line or ground line connected to the foregoing drive circuit has broken. In this way, current fed from the switching element for feed use can be reduced at a time of the foregoing broken wire when potential-fixing of a signal line connected to the control input terminal, occurs and along with this, there is no need to discharge current flowing into the control input terminal from the switching element for feed use, and so potential-fixing of the signal line is facilitated.

BRIEF DESCRIPTION OF THE DRAWINGS

Other features and advantages of the present invention will be appreciated, as well as methods of operation and the function of the related parts, from a study of the following detailed description, the appended claims, and the drawings, all of which from a part of this application. In the drawings:

FIG. 5 is a sectional view taken along line V—V of FIG. 4;

DETAILED DESCRIPTION OF THE PREFERRED EMBODIMENT

An air-flow control valve as a bidirectional flow control valve and a drive circuit thereof will be described hereinafter with reference to the drawings.

Figure 4:
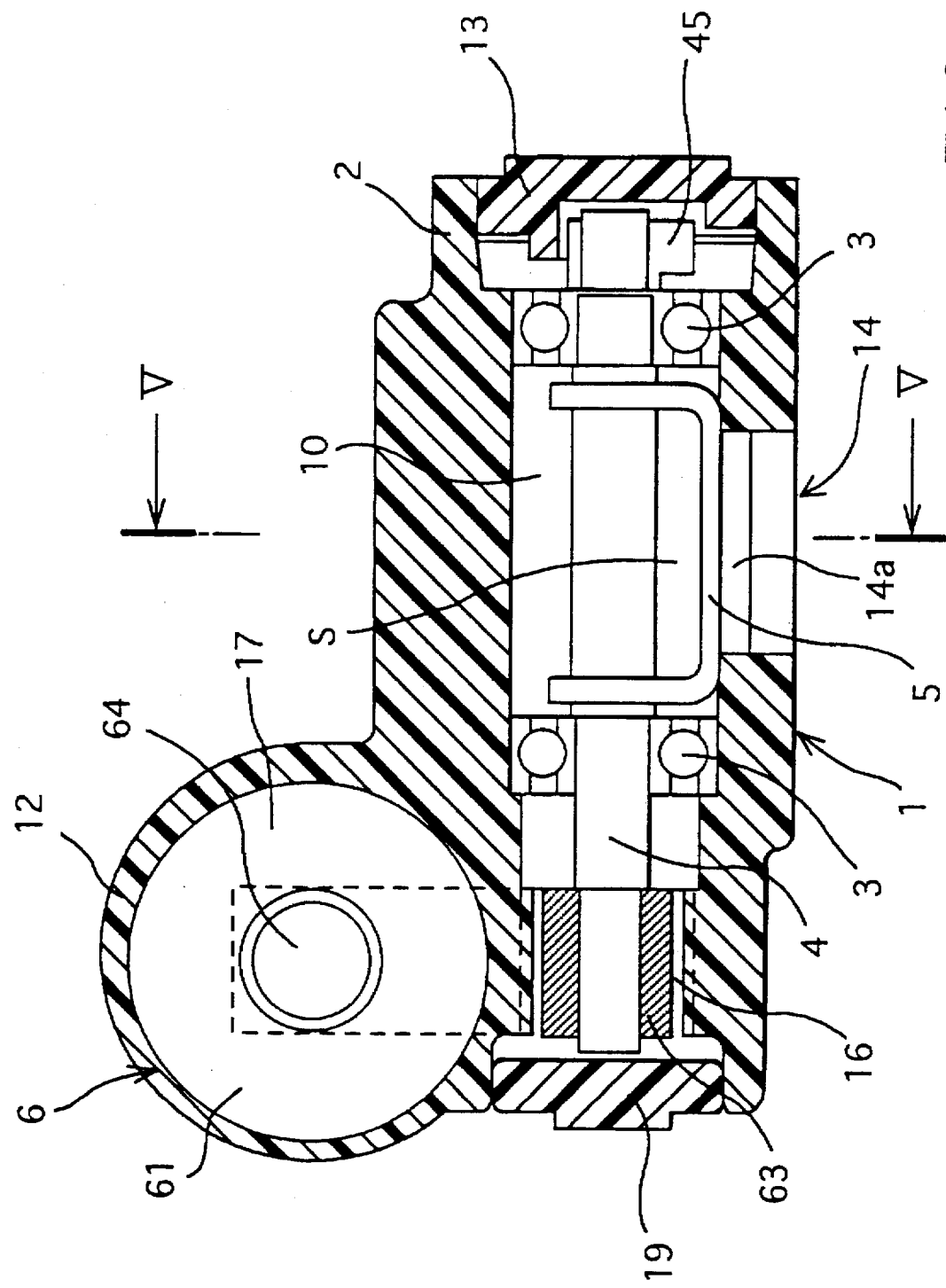
FIG. 4 is an axial sectional view of the flow control valve of FIG. 1.

An axial assembly sectional view of an air-flow control valve according to this embodiment is illustrated in FIG. 4, and a radial sectional view thereof is illustrated in FIG. 5.

This air-flow control valve has a housing 1 to form an exterior appearance and so on, and the housing 1 is composed of a valve housing portion 2 having a valve housing space 10 of a tubular configuration open at both ends, and a solenoid housing portion 12 formed integrally at one axial end of the valve housing portion 2. A pair of ball bearings 3 are inserted at both end portions of an inner peripheral surface of the valve housing portion 2 facing the valve housing space 10. These ball bearings 3 support a rotating shaft 4, and a needle valve 5 is positioned between the pair of ball bearings 3 and fixed to the rotating shaft 4. A plate 13 is inserted into a right-hand end opening of the valve housing portion 2 to close same. A valve chamber S is formed and partitioned by the inner peripheral surface of the valve housing portion 2 and end faces of the two ball bearings 3.

The valve chamber S is communicated with an air-intake space of an external portion via an intake hole 11a opened on the valve housing portion 2, as well as being communicated with an air discharge space of an external portion via a discharge port 14a and main discharge hole 14 opened on the valve housing portion 2 and being communicated with a pipe for discharge use (not illustrated). A degree of opening of the discharge holes 14 and discharge port 14a is controlled by rotation of the needle valve 5 as will be described later, and flow is controlled thereby.

Figure 6:
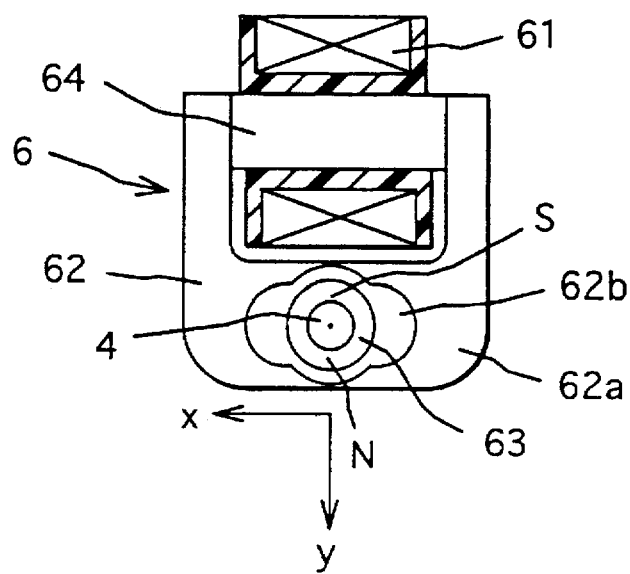
FIG. 6 is a sectional view of a rotary actuator.

The solenoid housing portion 12 has a magnet-rotor housing space 16 of a tubular configuration open at both ends formed adjacent to a valve housing space 10 coaxially with the valve chamber S, and a coil housing space 17 of a tubular configuration open at both ends formed adjacent to a magnet-rotor housing space 16 at a right angle which does not intersect with the magnet-rotor housing space 16. A coil portion 61 of a rotary solenoid 6 illustrated in FIG. 6 is inserted into the coil housing space 17, and a base portion 62a of a yoke 62 of the rotary solenoid 6 is housed within the magnet-rotor housing space 16.

A permanent magnet 63 is fitted and fixed to a left-hand end portion of the rotating shaft 4, and the permanent magnet 63 is inserted into the magnet-rotor chamber 16 and is housed so as to freely rotate in an opening 62b, which is opened to the base portion 62a of the yoke 62. A plate 19 is inserted into a left-hand end opening of the magnet-rotor chamber 16 to close same.

By controlling the size and direction of current flowing to a coil 61, an amount of magnetic flux flowing through a magnetic circuit composed of the yoke 62 and a core 64 made respectively, of soft magnetic material changes, and a center position and magnitude of magnetic poles facing the opening 62b of the base portion 62a of the yoke 62 change due to this change. As a result of this, these magnetic poles attract or repel a magnetic pole formed on the permanent magnet 63 fixed to the rotating shaft 4, and ultimately the permanent magnet 63 and rotating shaft 4 rotate due to control of the size and direction of current flowing to the coil 61.

Figure 1:
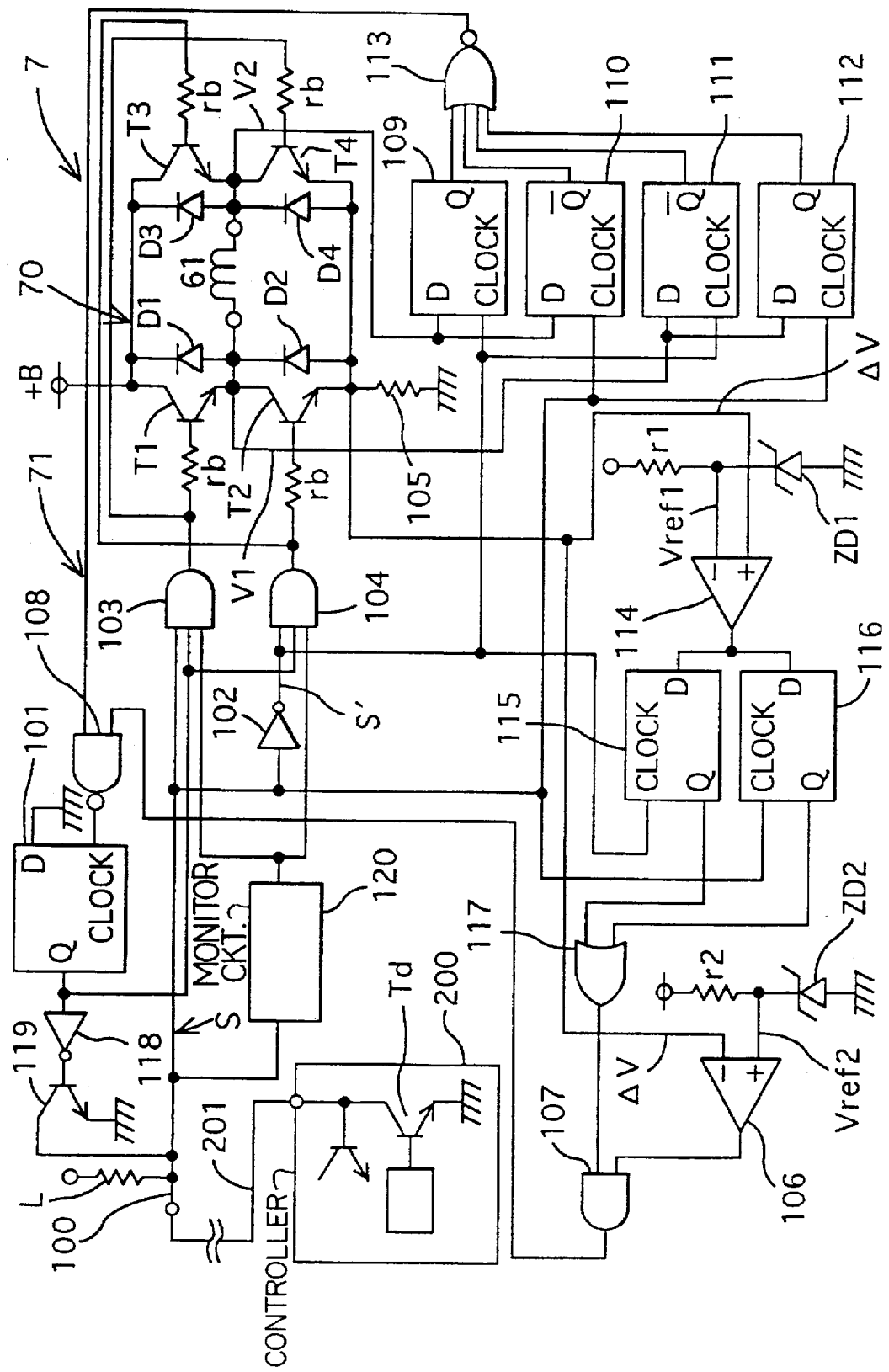
FIG. 1 is a circuit diagram of a drive circuit for a bidirectional flow control valve according to the present embodiment.

An example of a drive circuit 7 to drive the rotary solenoid 6 is illustrated in FIG. 1.

The drive circuit 7 is composed of an H-type bridge circuit 70, and a control circuit 71 to control the H-type bridge circuit 70.

The H-type bridge circuit 70 is composed of NPN bipolar transistors T1 to T4. The transistor T1 (the first switch in terms of the present invention) connects a high-level power-source terminal (battery voltage terminal) +B and one end of the coil 61 of the rotary solenoid 6; the transistor T2 (the second switch in terms of the present invention) connects one end of the coil 61 to a ground line (low-level power-source terminal) via a resistor 105 for current-detection use; the transistor T3 (the third switch in terms of the present invention) connects the high-level power-source terminal (battery voltage terminal) +B and another end of the coil 61 of the rotary solenoid 6; and the transistor T4 (the fourth switch in terms of the present invention) connects the other end of the coil 61 to the ground line (low-level power-source terminal) via the resistor 105 for current-detection use. D1 to D4 are flyback diodes.

The control circuit 71 will be described hereinafter.

The control circuit 71 has an input terminal 100 connected via a transmission line 201 to a controller 200 to output an opening-degree command signal S, and a load resistor L to structure a load of a drive transistor (opening-degree command-signal output transistor) Td of an open collector of the controller 200 is connected to the input terminal 100. The controller 200 is not included in the control circuit 71.

The opening-degree command signal s input to the input terminal 100 is input to an AND circuit 103, and is inverted by a NOT circuit 102 and input to an AND circuit 104. Electrical-potential fluctuation of the input terminal 100 is input to an opening-degree command monitor circuit 120, and an output signal of the circuit 120 is input to the AND circuits 103 and 104.

Meanwhile, the potential of the foregoing one end of the coil 61 is input to an input terminal D of D flipflops 111 and 112, an inverted opening-degree command signal S' is input to a clock input terminal of the D flipflop 111, and the opening-degree command signal S is input to a clock input terminal of the D flipflop 112. Additionally, the potential of the foregoing other end of the coil 61 is input to an input terminal D of D flipflops 109 and 110, an inverted opening-degree command signal S' is input to a clock input terminal of the D flipflop 109, and the opening-degree command signal S is input to a clock input terminal of the D flipflop 110. The Q output of these D flipflops 109 and 112 and the inverse-Q output of the D flipflops 110 and 111 are input via a NOR circuit 113 to a NAND circuit 108.

Moreover, a reference voltage Vref1 output from a constant-voltage circuit composed of a resistor r1 and constant-voltage diode ZD1 is compared with a voltage drop ΔV of the resistor 105 for current-detection use by a comparator 114, and output from the comparator 114 is input to an input terminal D of D flipflops 115 and 116. An inverted opening-degree command signal S' is input to a clock input terminal of the D flipflop 115, and the opening-degree command signal S is input to a clock input terminal of the D flipflop 116.

The Q output of these D flipflops 115 and 116 is logically added by an OR circuit 117 and input via an AND circuit 107 to the NAND circuit 108. Meanwhile, a reference voltage Vref2 output from a constant-voltage circuit composed of a resistor r2 and constant-voltage diode ZD2 is compared with the voltage drop ΔV of the resistor 105 for current-detection use by a comparator 106, and output from the comparator 106 via the AND circuit 107 to the NAND circuit 108.

Output from the NAND circuit 108 is input to a clock input terminal of a D flipflop 101, and a low level is constantly input to an input terminal D thereof. Q output of the D flipflop 101 is input to the AND circuits 103 and 104, and along with this, is input via a NAND circuit 118 to a driver transistor 119.

A mode of operation of a drive circuit 7 indicated in FIG. 1 will be described hereinafter.

(When the Transistors T1 to T4 are Normal)

When the transistors T1 to T4 are normal, a Q output terminal of the flipflop 101 outputs a high level, and so the output of the AND circuit 103 tracks the opening-degree command signal S on the basis of the opening-degree command signal S input to the input terminal 100.

Meanwhile, the output of the AND circuit 104 goes to a low level when the opening-degree command signal S is at high level, due to output inversion by the NOT circuit 102.

Consequently, when the opening-degree command signal S is at high level (hereinafter also termed "on duty"), the transistors T1 and T4 switch on, and the transistors T2 and T3 switch off. Meanwhile, when the opening-degree command signal S is at low level (hereinafter also termed "off duty"), the transistors T1 and T4 switch off, and the transistors T2 and T3 switch on. A current i1 of one direction flows to the drive coil 61 due to the switching-on of the transistors T1 and T4, and a current i2 of an opposite direction flows to the drive coil 61 due to the switching-on of the transistors T2 and T3.

That is to say, according to the present embodiment, the transistors T1 and T4 constituting one pair and the transistors T2 and T3 constituting another pair normally perform complementary actions. Furthermore, the opening-degree command signal S repeats the above-described bidirectional mutual conduction with each cycle of a predetermined carrier frequency. Consequently, when a current i1 in one direction flows and a current i2 in an opposite direction flows at each cycle herein, an average current (i1–i2) can be considered to flow to the coil 61. According to this conduction method, control is simple and moreover linearity of the relationship between duty ratio and degree of opening (average current) is improved (hysteresis is reduced).

Figure 3:
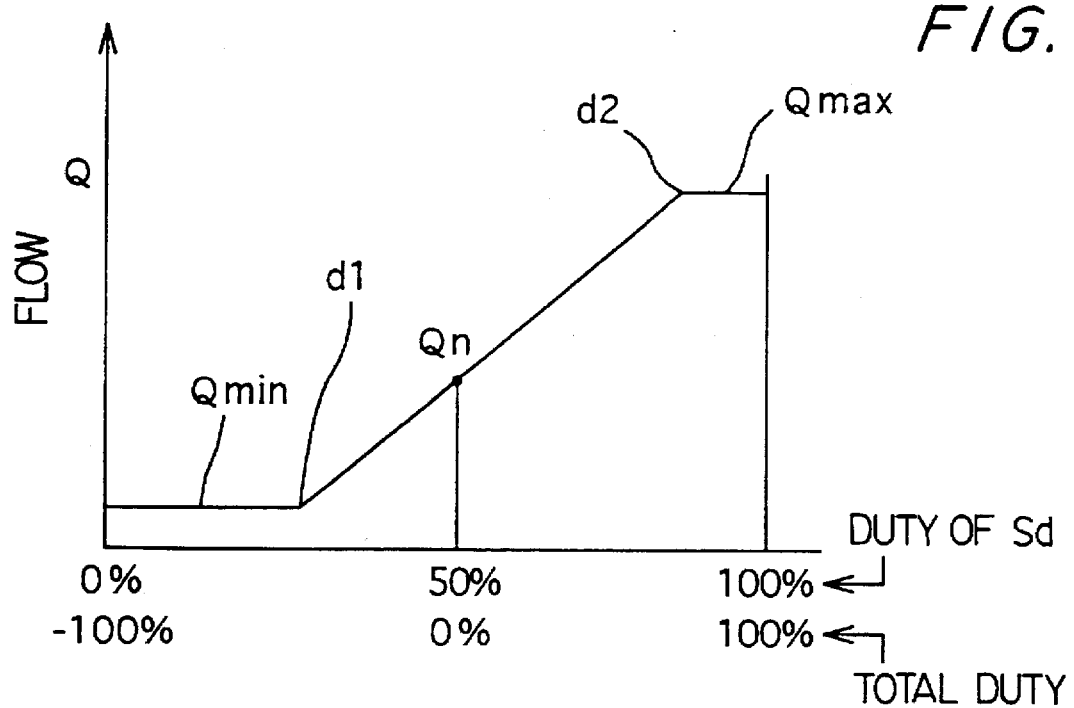
FIG. 3 is a characteristic diagram indicating a relationship between duty ratio of input voltage and air flow of the flow control valve of FIG. 1.

FIG. 3 illustrates a relationship between this opening-degree command signal S and flow Q.

When the duty ratio of the opening-degree command signal S is from 0 to d1, a minimum flow Qmin determined by valve leakage flows, and when the duty ratio of Qmin becomes d1, ignoring herein the amount of reactance of the coil 61 which is a load to facilitate comprehension, the duty ratio of the current i1 becomes d1 and the duty ratio of the current i2 becomes 1–d1, and the overall duty ratio becomes 2d1–1, as was described above. The present embodiment is established so that the valve is opened substantially and flow Q increases when the opening-degree command signal S becomes d1 or more. Additionally, when the duty ratio of the opening-degree command signal S becomes 50%, the overall duty ratio becomes 0, which is identical to nonconduction, and at this time the permanent magnet 63 rotates at the most stable position (this position being made to be flow 50%) due to its own magnetism.

Furthermore, when the duty ratio of the opening-degree command signal S increases, the overall duty ratio (2d1–1) becomes positive and current is inverted; when the duty ratio of the opening-degree command signal S becomes d2, the valve becomes substantially fully open; and when the duty ratio of the opening-degree command signal S becomes 1, the overall duty ratio (2d1–1) also becomes 1, and full conduction in the opposite direction is obtained.

To describe this in concrete terms, when an average current to the coil 61 in one direction increases gradually, the N pole and S pole of the permanent magnet 63 correspondingly attract and repel the N pole and S pole formed facing the opening 62b of the yoke 62, and there is clockwise rotation from an air-gap minimum-angle position (corresponding to the above minimum flow Qmin) to the rotation-angle position corresponding to the duty ratio of the current. When the direction of conduction of the average current is reversed, naturally there is counterclockwise rotation from the above-described air-gap minimum-angle position to the rotation-angle position corresponding to the duty ratio of the current by a similar principle.

A mode of operation at a time of abnormality will be described hereinafter.

(When the Transistor T1 is Shorted)

When the transistors T3 and T2 switch on, large current flows through the transistors T1 and T2, and so this current is detected using the current-detection resistor 105, and input to the comparator 106. When another input of the comparator 106 is adjusted to voltage Vref2 corresponding to overcurrent to be detected, the output of the comparator 106 goes low at a time of overcurrent occurrence. As a result of this, output of the AND gate 107 goes low, output of the NAND gate 108 changes from low to high, Q output of the flipflop 101 goes low, output of the AND gates 103 and 104 also goes low irrespective of duty input, the transistors T1 to T4 are switched off, and conduction to the coil 61 is cut off.

Conduction to the coil 61 can similarly be cut off at a time of shorting of another transistor T2 to T4 or the coil 61 as well by detecting overcurrent.

(At a Time of an Open Fault of the Transistor T1)

When a terminal voltage (the end-portion voltage in terms of the present invention) V1 of the coil 61 is loaded to the flipflop 111 at the timing at which the opening-degree command signal S goes from high to low, the terminal voltage V1 goes low due to an open fault of the transistor T1 which is normally high, and so reverse-Q output of the flipflop 111 goes high, and output of the NOR gate 113 goes low. Output of the NAND gate 108 changes from low to high, output Q of the flipflop 111 goes low, output of the AND gates 103 and 104 also goes low irrespective of duty input, the transistors T1 to T4 are switched off, and conduction to the coil 61 is cut off.

Conduction to the coil 61 is similarly cut off at a time of an open fault of another transistor T2 to T4 as well due to output of the flipflop 109, 110, or 112 going high.

Figure 2:
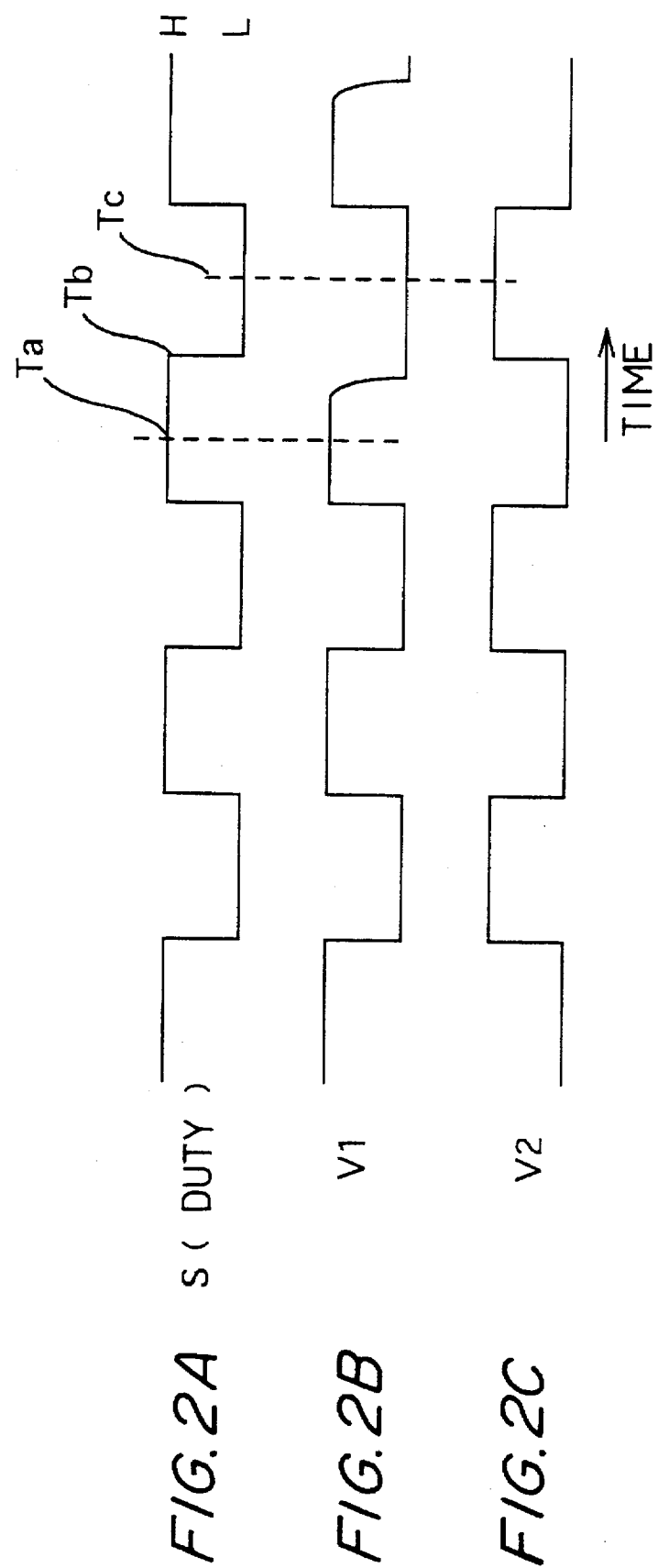
FIGS. 2A to 2C are a timing chart of electrical potential of respective portions of the drive circuit of FIG. 1.

The significance of comparing the terminal voltage V1 or V2 of the coil 61 and opening-degree command signal S or S' of the transistors T1 to T4 at the switching timing of the opening-degree command signal S or S' of the transistors T1 to T4 will be described hereinafter with reference to FIGS. 2A to 2C.

At the falling edge of the opening-degree command signal S going from high (H) to low (L), when the several transistors T1 to T4 are normal, then after a slight operational delay from the falling edge, the terminal voltages V1 and V2 of the coil 61 are also inverted and the terminal voltage V1 also changes from high to low.

Herein, if the transistor T1 experiences an open fault at a time (for example time Ta) prior to the foregoing falling edge, the terminal voltage V1 which should still be high at the time of the falling edge because of the above-described operational delay instead goes low, and so an open fault of the transistor T1 can reliably be detected.

Similarly, if the transistor T2 suffers an open fault, the terminal voltage V1 which should still be high because of the above-described operational delay instead goes low at the time of the falling edge (i.e., the rising edge at which the opening-degree command signal S changes from low (L) to high (H)) at which the inverse opening-degree command signal S' changes from high (H) to low (L), and so an open fault of the transistor T2 can reliably be detected.

Similarly, if the transistor T3 experiences an open fault at a time (for example time Tc) prior to the falling edge at which the inverse opening-degree command signal S' changes from high (H) to low (L), the terminal voltage V2 which should still be high at the time of the falling edge because of the above-described operational delay instead goes low, and so an open fault of the transistor T3 can reliably be detected.

Similarly, if the transistor T4 suffers an open fault, the terminal voltage V4 which should still be high because of the above-described operational delay instead goes low at the time of the falling edge (i.e., the rising edge at which the opening-degree command signal S' changes from low (L) to high (H)) at which the inverse opening-degree command signal S changes from high (H) to low (L), and so an open fault of the transistor T4 can reliably be detected.

Furthermore, flyback diodes D1 to D4 are individually connected in parallel with the several transistors T1 to T4 in the H-type bridge circuit 70 according to the present embodiment, the two ends of the coil 61 are conducted through these flyback diodes D1 to D4, and a state of the terminal voltages V1 and V2 may be generated which indicates that the transistors T1 to T4 have not experienced an open fault, irrespective of whether the transistors T1 to T4 have actually experienced an open fault.

Consequently, an open fault of the transistors T1 to T4 can be detected with the greatest accuracy when a relationship of the terminal voltages V1 and V2 and the opening-degree command signal S and inverse opening-degree command signal S' at a change timing (or, more accurately, immediately prior to change) of the opening-degree command signal S at which flyback energy is the smallest or can be ignored is investigated.

(At a Time of an Open Fault of the Coil 61)

Voltage drop of the current-detection resistor 105 becomes 0 at the when changing either high to low or low to high of the opening-degree command signal S. Consequently, the output of the comparator 114 at one terminal of which is input the reference voltage Vref1 adjusted to a value corresponding to current of several tens of milliamperes flowing to the resistor 105 by the resistor r1 and constant-voltage diode ZD1 remains low, and the outputs Q of the flipflops 115 and 116 both go low. For this reason, output of the OR gate 117 goes low, output of the AND gate 107 also goes low, output of the NAND gate 108 changes from low to high, output Q of the flipflop 101 goes low, output of the AND gates 103 and 104 also goes low irrespective of duty input, the transistors T1 to T4 are switched off, and conduction to the coil 61 is cut off.

Additionally, when the output of the flipflop 101 has gone low, the input terminal 100 is also fixed low by the inverters 118 and an 119, and occurrence of an abnormality can be reported to the controller 200 because of this. Additionally, a reception transistor (not illustrated) where a control input terminal is connected to the line 201 is installed in the controller 200, and an abnormality at the drive circuit 7 can be discovered by a drop in electrical potential of the line 201 while the driver transistor Td is off. In addition, the controller 200 can determine the occurrence of a broken wire of the line 201 or a halted supply of power-source voltage to the drive circuit 7 in a case where input potential of the above-described reception transistor is normally low.

(Modification)

Figure 7:
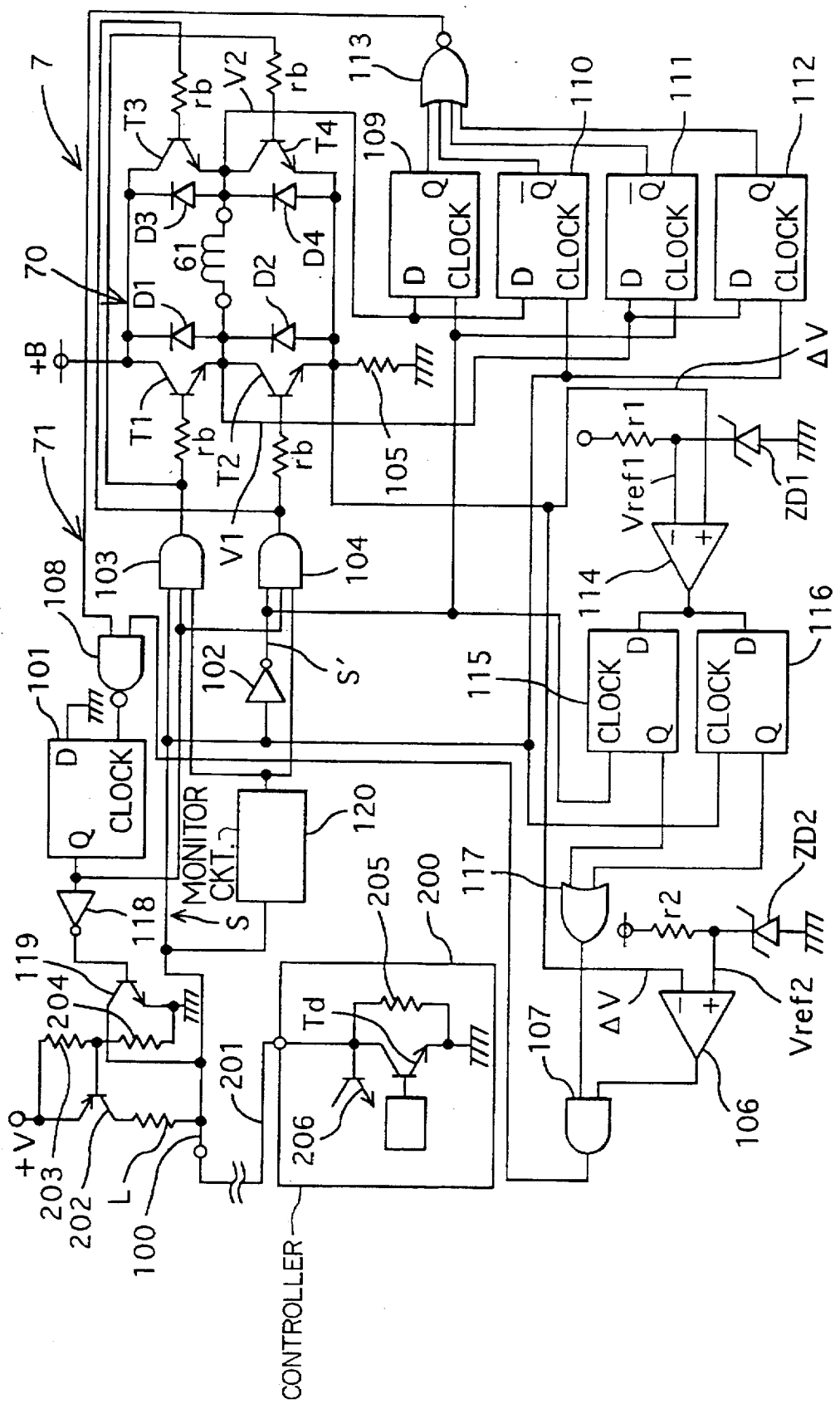
FIG. 7 is a circuit diagram indicating a modification of a drive circuit for a bidirectional flow control valve according to the present invention.

FIG. 7 is a circuit diagram indicating a modification of the circuit indicated in FIG. 1.

In FIG. 7, a transistor 202 is inserted between the load resistor L and high-level power-source line +V of FIG. 1, a resistor 203 is connected between a base of the transistor 202 and the high-level power-source line +V, a resistor 204 is connected between the base of the transistor 202 and the ground line, and moreover, a bypass resistor 205 is connected in parallel between the emitter and collector of the transistor Td. The high-level power-source line +V can of course be made to be common with the high-level power source (battery voltage) +B of the H-type bridge circuit 70, and in addition to this, a power-source voltage in which the high-level power source (battery voltage) +B has been made constant voltage can also be applied.

In this way, the transistor 202 switches off and feed to the line 201 from the drive circuit 7 is interrupted in a case of a broken wire in the ground line of FIG. 7. As a result of this, the line 201 becomes fixed at ground potential of the controller 200 due to the resistor 205 within the controller 200, irrespective of an operating state of the transistor Td. Consequently, the controller 200 can detect a broken wire in the ground line of the drive circuit 7 by the potential state of the line 201 detected by a transistor 206.

A case of a broken wire of the high-level power-source line +V of the drive circuit 7 may also be considered. In this case as well, feed to the line 201 via the transistor 202 and resistor L is not performed, and the line 201 assumes ground potential, similarly to the above-described broken wire of the ground line. Consequently, the controller 200 can detect a broken wire in the high-level power-source line +V of the drive circuit 7 by the potential state of the line 201 detected by the transistor 206.

Furthermore, the above-mentioned broken-wire detection by the transistor 206 may be executed by for example, the method which will be described hereinafter. The line 201 is caused to periodically go to high level by application of a PWM pulse signal or the like where, for example, a duty ratio exceeds 0%, and a possibility of occurrence of the above-described broken-wire abnormality can be determined in a case where the line 201 in this state is at ground potential for a predetermined time or longer.

Moreover, the transistor 202 and resistor L in FIG. 7 structure a feed circuit in terms of the present invention, the resistors 203 and 204 structure an interruption circuit portion in terms of the present invention, and the resistor 205 structures a signal-line potential-fixing circuit portion. Arrangement of the resistor 205 to a position close to the control circuit 71 of the signal line 201 is of course also possible.

(Input Abnormality of the Opening-degree Command Signal S)

Additionally, in a case where the opening-degree command signal S does not change for a predetermined time (at least one cycle or more of the carrier) or longer due to an abnormality such as a broken wire in the line 201, the opening-degree command monitor circuit 120 determines a reception abnormality of the opening-degree command signal S and output of the opening-degree command monitor circuit 120 is caused to go low, and the transistors T1 to T4 can be switched off thereby.

Moreover, because such an opening-degree command monitor circuit 120 itself can easily be realized by hardware of microcomputer software, illustration and description of the structure thereof are omitted. Additionally, an inverter of NPN bipolar transistor format was employed as the H-type bridge circuit 70 according to the above-described embodiment, but a complementary bipolar inverter or a complementary CMOS inverter can also be employed, and an NMOS inverter can be employed as well.

What is claimed is:

1. A drive circuit for a directional flow control valve, comprising:

an H-type bridge circuit to control current conducted to a coil for driving a bidirectional flow control valve which assumes an intermediate position responsive to current not being conducted to said coil, where said bidirectional flow control valve is opened from said intermediate position by an increase in current of one direction to said coil, and where said bidirectional flow control valve is closed from said intermediate position by an increase in current of an opposite direction to said coil, said H-type bridge circuit including a first switch to connect a high-level power-source terminal to an end of said coil, a second switch to connect a low-level power-source terminal to an end of said coil, a third switch to connect said high-level power-source terminal to another end of said coil and a fourth switch to connect said low-level power-source terminal to another end of said coil; and a control circuit which alternatingly repeats, in a predetermined cycle, a normal-direction conduction mode to switch on said first and fourth switches and switch off said second and third switches and a reverse-direction conduction mode to switch on said second and third switches and switch off said first and fourth switches in order to control a position of said bidirectional flow control valve, wherein said control circuit executes each of said normal-direction conduction mode and said reverse-direction conduction mode during equal periods of time in said predetermined cycle to maintain said bidirectional flow control valve in said intermediate position, executes said normal-direction conduction mode longer than said reverse-direction conduction mode in said predetermined cycle so as to increase current flowing in said one direction to said coil to open said bidirectional flow control valve from said intermediate position, and executes said normal-direction conduction mode shorter than said reverse-direction conduction mode in said predetermined cycle so as to increase current flowing in said opposite direction to said coil to close said bidirectional flow control valve from said intermediate position.

2. A drive circuit for a bidirectional flow control valve according to claim 1, wherein said control circuit includes a determination circuit which determines an occurrence of an open fault of at least one of said first through fourth switches based on an end-portion voltage of said coil obtained responsive to said control circuit changing conduction modes.

3. A drive circuit for a bidirectional flow control valve according to claim 1, wherein said control circuit includes a detection circuit which detects current flowing to said low-level power-source terminal from said coil, and a determination circuit which determines an open fault of said coil responsive to said current being equal to or smaller than a predetermined level.

4. A drive circuit for a bidirectional flow control valve according to claim 1, wherein said control circuit includes a detection circuit which detects current flowing to said coil, and a determination circuit which determines a short fault of at least one of said first through fourth switches responsive to said detection circuit detecting a current larger than a predetermined value.

5. A drive circuit for a bidirectional flow control valve according to claim 1, wherein said control circuit includes a detection circuit which detects current flowing to said coil, said control circuit switching off all of said first, second, third and fourth switches responsive to said detection circuit detecting a current larger than a predetermined value.

6. A drive circuit for bidirectional flow control valve according to claim 1, wherein said control circuit detects whether a position command signal, which is a PWM signal input to a control input terminal of said control circuit, changes within a predetermined time, and includes a determination circuit which determines an abnormality of said position command signal in a case of no change.

7. A drive circuit for a bidirectional flow control valve according to claim 2, wherein said control circuit fixes an electrical potential of a control input terminal of said control circuit to which a position command signal is input to a high-level power-source potential or low-level power-source potential at a time of detection of said fault.

8. A drive circuit for a bidirectional flow control valve according to claim 2, wherein said control circuit includes a feed-circuit portion having a switching element to feed current to a control input terminal of said control circuit to which a position command signal is input, an electrical potential fixing circuit portion to establish said control input terminal at a predetermined electrical potential, and an interruption circuit portion to interrupt said switching element responsive to one of a power-source line and a ground line applying one of a power-source voltage and ground voltage to said control circuit is disconnected.

* * * * *